(12) United States Patent
Lankston, II et al.

(10) Patent No.: US 8,462,508 B2
(45) Date of Patent: Jun. 11, 2013

(54) HEAT SINK WITH SURFACE-FORMED VAPOR CHAMBER BASE

(75) Inventors: Robert J. Lankston, II, Roseville, CA (US); Christopher G. Malone, Loomis, CA (US); Stephen D. Cromwell, Penryn, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1354 days.

(21) Appl. No.: 11/742,540

(22) Filed: Apr. 30, 2007

(65) Prior Publication Data

US 2008/0266800 A1    Oct. 30, 2008

(51) Int. Cl.
*H05K 7/20* (2006.01)
(52) U.S. Cl.
USPC .......................... 361/700; 361/689; 361/699
(58) Field of Classification Search
None
See application file for complete search history.

(56) References Cited

U.S. PATENT DOCUMENTS

| | | | | |
|---|---|---|---|---|
| 5,998,863 | A * | 12/1999 | Kobayashi et al. | 257/715 |
| 6,082,443 | A * | 7/2000 | Yamamoto et al. | 165/104.26 |
| 6,158,502 | A * | 12/2000 | Thomas | 165/104.26 |
| 6,302,192 | B1 * | 10/2001 | Dussinger et al. | 165/104.26 |
| 6,639,799 | B2 * | 10/2003 | Prasher et al. | 361/700 |
| 6,749,013 | B2 * | 6/2004 | Ikeda et al. | 165/104.26 |
| 6,874,568 | B2 * | 4/2005 | Lai | 165/104.26 |
| 6,889,756 | B1 * | 5/2005 | Hou | 165/104.33 |
| 7,180,179 | B2 * | 2/2007 | Mok et al. | 257/714 |
| 2006/0037737 | A1 * | 2/2006 | Chen et al. | 165/104.26 |
| 2006/0096740 | A1 | 5/2006 | Zheng | |
| 2006/0109628 | A1 | 5/2006 | Searby | |
| 2006/0113065 | A1 | 6/2006 | Wolford et al. | |
| 2006/0141675 | A1 | 6/2006 | Hwang et al. | |
| 2006/0237167 | A1 | 10/2006 | Lee | |
| 2006/0256531 | A1 | 11/2006 | Sauciuc et al. | |
| 2006/0279936 | A1 | 12/2006 | Karidis et al. | |
| 2006/0283579 | A1 | 12/2006 | Ghosh et al. | |
| 2007/0012429 | A1 | 1/2007 | Siu | |
| 2007/0017814 | A1 | 1/2007 | Hwang et al. | |
| 2007/0023879 | A1 | 2/2007 | Pandey et al. | |
| 2007/0044310 | A1 | 3/2007 | Wolford et al. | |

* cited by examiner

*Primary Examiner* — Boris Chervinsky

(57) ABSTRACT

A heat sink comprises a vapor chamber base formed in a three-dimensional arrangement that mirrors topology of underlying structures on a substrate upon which the heat sink can be mounted, and at least one fin coupled to the vapor chamber base.

20 Claims, 7 Drawing Sheets

HEAT SINK WITH SURFACE-FORMED VAPOR CHAMBER BASE

BACKGROUND

Many electronics systems have low-lying obstructions such as board components or socket attach mechanisms that limit the size of heat sinks, thus limiting thermal performance. Thickening the base enables the heat sink to be raised above the obstructions with fins placed over the top of the base. However, the thickened base increases conduction resistance and reduces temperatures for the fins furthest from the source, both of which degrade heat sink performance.

A common heat sink implementation uses a high conductivity material such as copper for constructing the base to minimize conduction resistance and maximize heat spreading. However, the added mass of a large copper base imposes a higher load on a heat sink attachment mechanism and increase the probability of failures due to shock and vibration. In addition, even a copper base may be insufficient to create suitable thermal performance.

Other heat sink implementations use heat pipes to aid in heat spreading. Unfortunately, the large bend radius of heat pipes can limit the geometry of the heat sink base and the solder or adhesive attaching the heat pipes to the base can significantly increase thermal resistance.

SUMMARY

An embodiment of a heat sink comprises a vapor chamber base formed in a three-dimensional arrangement that mirrors topology of underlying structures on a substrate upon which the heat sink can be mounted, and at least one fin coupled to the vapor chamber base.

BRIEF DESCRIPTION OF THE DRAWINGS

Embodiments of the invention relating to both structure and method of operation may best be understood by referring to the following description and accompanying drawings.

DETAILED DESCRIPTION

A heat sink incorporates a vapor chamber base enabling the heat sink to extend up and over obstructions while maintaining a uniform base temperature and minimizing conduction losses. The illustrative structure enables larger heat sinks in areas with low lying obstructions.

Referring to FIG. 1, a pictorial cross-sectional view illustrates an embodiment of a heat sink 100 with a surface-formed vapor chamber base 102. The heat sink 100 comprises a vapor chamber base 102 formed in a three-dimensional arrangement that mirrors topology of underlying structures on a substrate upon which the heat sink 100 can be mounted. One or more fins 104 are coupled to the vapor chamber base 102.

The vapor chamber base 102 can be formed with a three-dimensional arrangement that is configured to maintain a controlled distance between an outer edge of the vapor chamber base 102 and the underlying topology.

In some embodiments, the vapor chamber base 102 can be constructed with a three-dimensional arrangement which is configured to extend over obstructions while maintaining a uniform base temperature and reducing or minimizing conduction losses.

The vapor chamber base 102 can be formed with a thickness sufficient to raise above and clear obstructions on the underlying topology.

In an illustrative embodiment, the fins 104 can be bonded directly to the vapor chamber base 102, resulting in further improvement in thermal performance by facilitating heat transfer thereby reducing temperature gradients in the heat sink 100.

Figure 1A:
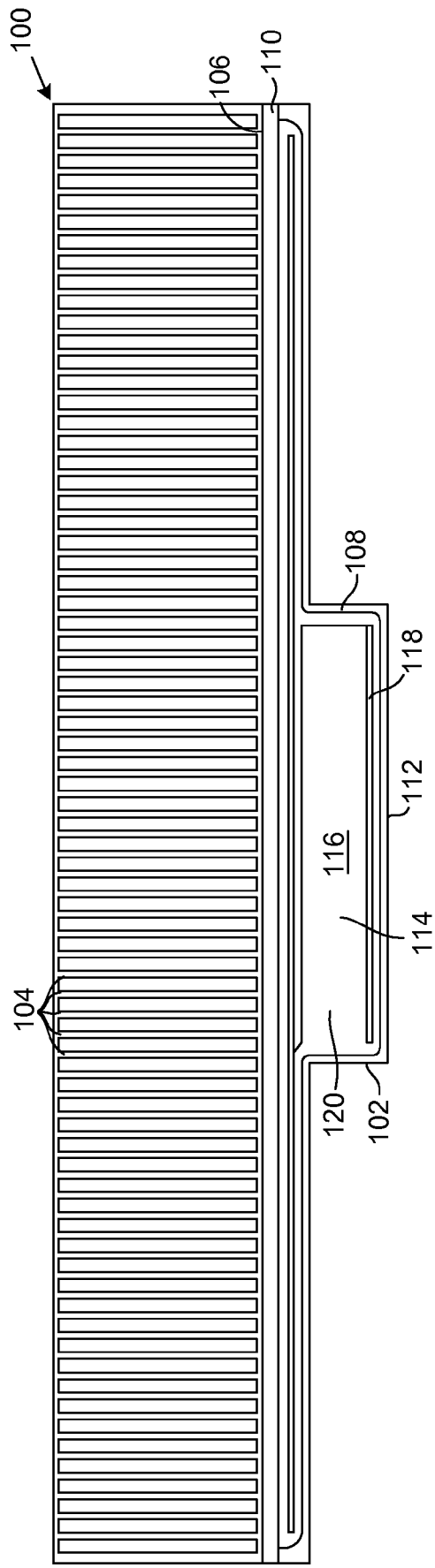
FIGS. 1A and 1B are pictorial cross-sectional views illustrating embodiments of a heat sink with a surface-formed vapor chamber base.

As shown in FIG. 1A, the vapor chamber base 102 can be formed with thickness sufficient to raise above and clear obstructions on the underlying topology and which extends to a planar surface 106 opposite the underlying topology. The fins 104 can be coupled to the planar surface 106.

The illustrative heat sink 100 can be formed with the vapor chamber base 102 further comprising a shell 108 formed in a three-dimensional arrangement that mirrors topology of underlying structures and has thickness sufficient to raise above and clear obstructions on the underlying topology. A planar lid 110 can be configured for coupling to the shell 108.

The shell 108 can be configured with a relatively small planar area at a surface 112 for mounting adjacent the underlying structures and which expands laterally as distance from the underlying structures increases.

The shell 108 can be configured with an interior cavity 114 that forms a chamber 116 within the vapor chamber base 102. The planar lid 110 can be configured for attachment to the shell 108 so that the chamber 116 is a sealed, inner vapor chamber. A wicking material 118 can be placed in the vapor chamber 116 to enable fluid transport from the lid 110 to a heat source. A fluid 120 is injected into the vapor chamber 116.

Figure 1B:
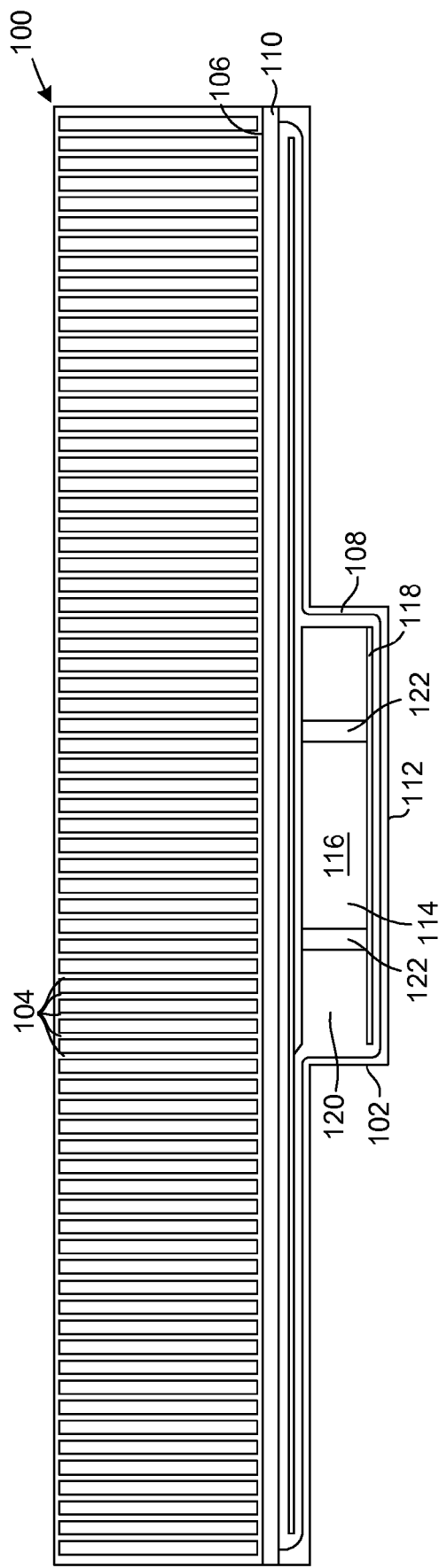

Referring to FIG. 1B, a heat sink 100 can be formed in some embodiments with a support structure 122 formed in the chamber configured to increase strength and facilitate fluid transport of the vapor chamber base 102.

In the illustrative embodiment, the vapor chamber base 102 has a bottom shell 108 and a flat lid 110. The illustrative bottom shell 108 is small at the bottom and increases in width at the top, forming a larger area for fins 104. The transition from bottom to top can either be stepped or tapered in such a way as to bring the base up and over obstructions. The bottom shell 108 can be formed as a deep-drawn structure, creating an open cavity 114 in the middle, for example formed similar to a cup or bowl. Other techniques for forming the bottom shell 108 include molding, machining, or other suitable techniques. Support structure 122 can be built in the cavity 114 to increase the stiffness of the base 102 and facilitate fluid transport. The flat lid 110 is attached to the top of the bottom shell 108, creating a sealed, inner vapor chamber 116. A wicking material 118 can be placed in the chamber 116 to enable fluid transport from the lid 110 to a heat source. The chamber 116 is typically injected with a small amount of the working fluid 120, evacuated of air, and sealed. Fins 104 can be attached to the top of the lid 110 or other suitable location, even the bottom of overhanging arms of the bottom shell 108. The illustrative configuration creates a heat sink 100 with phase heat transfer, where the fluid 120 is evaporated by the heat source, travels to the lid 110 where the fluid 120 is cooled by the fins 104 and condenses. The fluid 120 is then drawn back to the source by the wicking 118 and the cycle repeats.

The surface-formed vapor chamber base 102 enables increased or maximum heat spreading throughout the base 102 creating a nearly uniform base-to-fin interface temperature, improving or maximizing heat sink performance. Similarly, the surface-formed vapor chamber base 102 enables very small temperature drop from the bottom to the top of the base 102 so that a large base thickness can be formed with almost no degradation of thermal performance. Thus the heat sink 100 can extend up and over nearby obstructions, increasing fin area and improving performance.

Additionally, in some embodiments the heat sink 100 can be configured with most of the surface-formed vapor chamber base 102 as a cavity, empty space that attains a much lighter structure than a solid base of similar volume. The hollow structure can reduce the amount of load to hold the heat sink 100, reducing the cost of attachment hardware and reducing the chance of failure due to shock and vibration.

Figure 2:
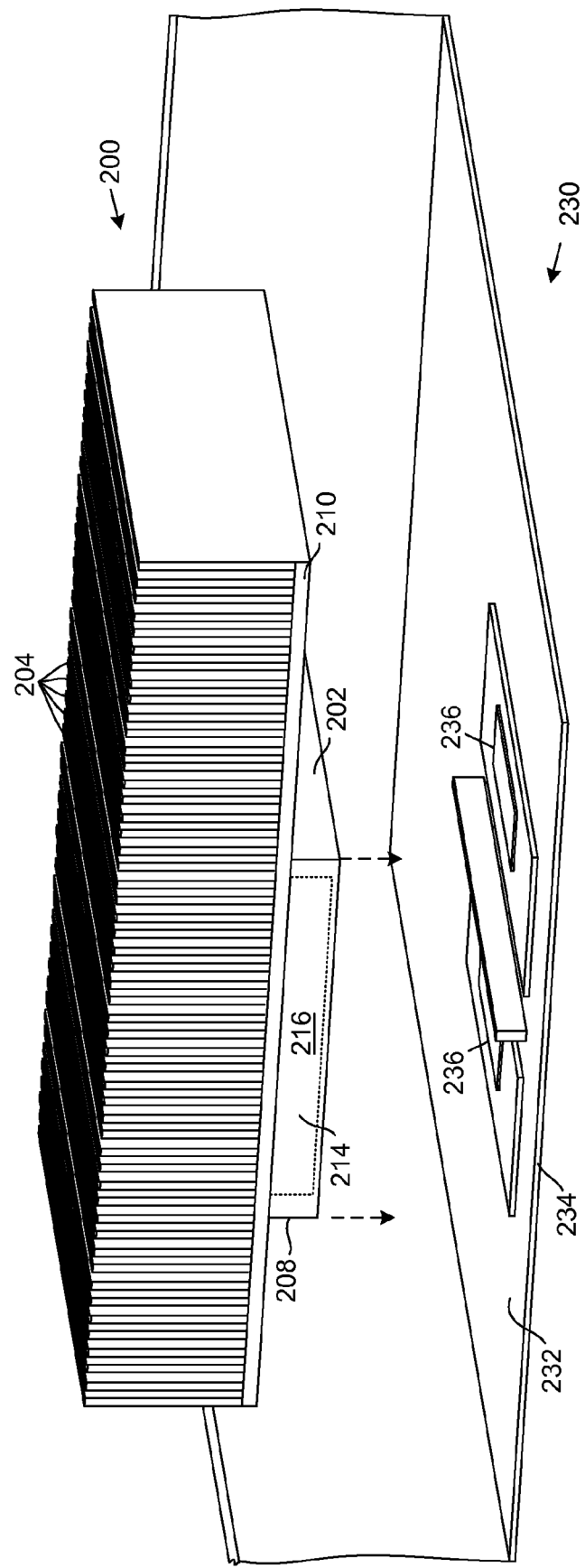
FIG. 2 is an exploded, cross-sectional pictorial view depicting an embodiment of an electronic system that includes a heat sink with a surface-formed vapor chamber base.

Referring to FIG. 2, an exploded, cross-sectional pictorial view illustrates an embodiment of an electronic system 230 that includes a heat sink 200 with a surface-formed vapor chamber base 202. The electronic system 230 comprising an electronic assembly 232 including a substrate 234 and one or more components 236 mounted on the substrate 234. A heat sink 200 is configured for mounting on the electronic assembly 232 and comprises a vapor chamber base 202 formed in a three-dimensional arrangement that mirrors topology of components 236 on the substrate 234 upon which the heat sink 200 is mounted. One or more fins 204 are coupled to the vapor chamber base 202.

In an illustrative embodiment, the fins 204 can be bonded directly to the vapor chamber base 202.

In an illustrative embodiment of the electronic system 230, the vapor chamber base 202 can further comprise a shell 208 formed in a three-dimensional arrangement that mirrors topology of underlying structures, such as the components 236 on the substrate 234, and has thickness sufficient to raise above and clear obstructions on the underlying topology. The shell 208 can be configured with a relatively small planar area at a surface for mounting adjacent the underlying structures and expanding laterally as distance from the underlying structures increases. The shell 208 can also have an interior cavity 214 that forms a chamber 216 within the vapor chamber base 202. A planar lid 210 can be attached to the shell 208 so that the chamber 216 is a sealed, inner vapor chamber. A wicking material 206 can be placed in the vapor chamber 216 to enable fluid transport from the lid 210 to a heat source. The vapor chamber 216 can be injected with fluid.

In some embodiments, a support structure can be formed in the chamber 216 and configured to increase strength and facilitate fluid transport of the vapor chamber base 202.

Figure 3A:
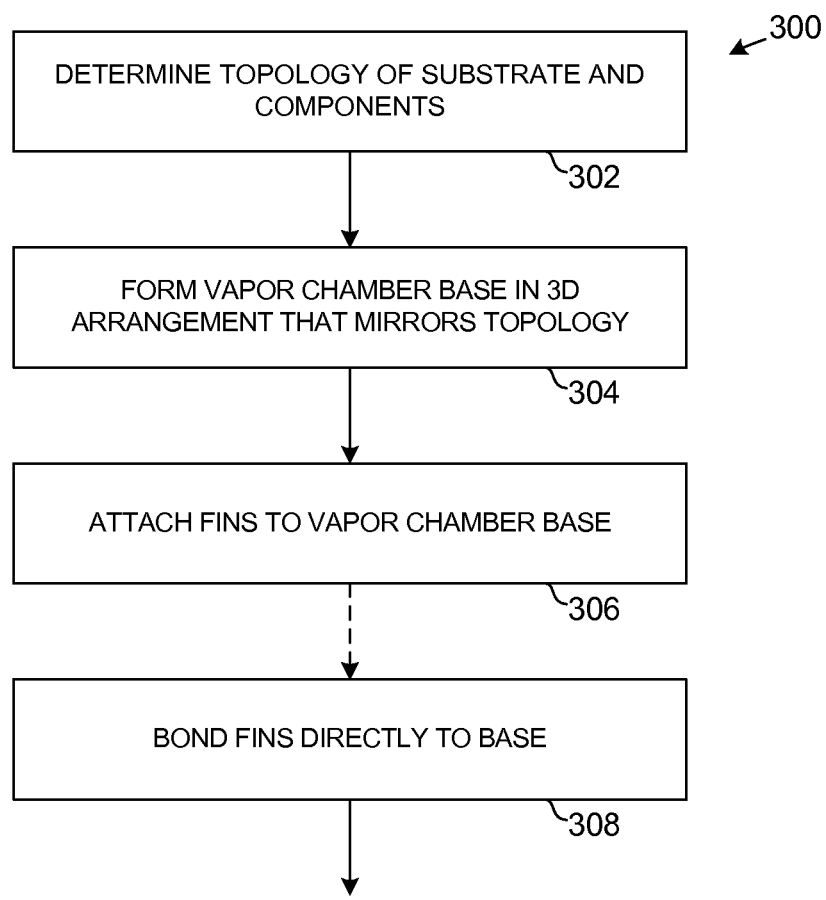
FIGS. 3A through 3C multiple flow charts show one or more embodiments or aspects of a method for constructing a heat sink with a surface-formed vapor chamber base.
Figure 3B:
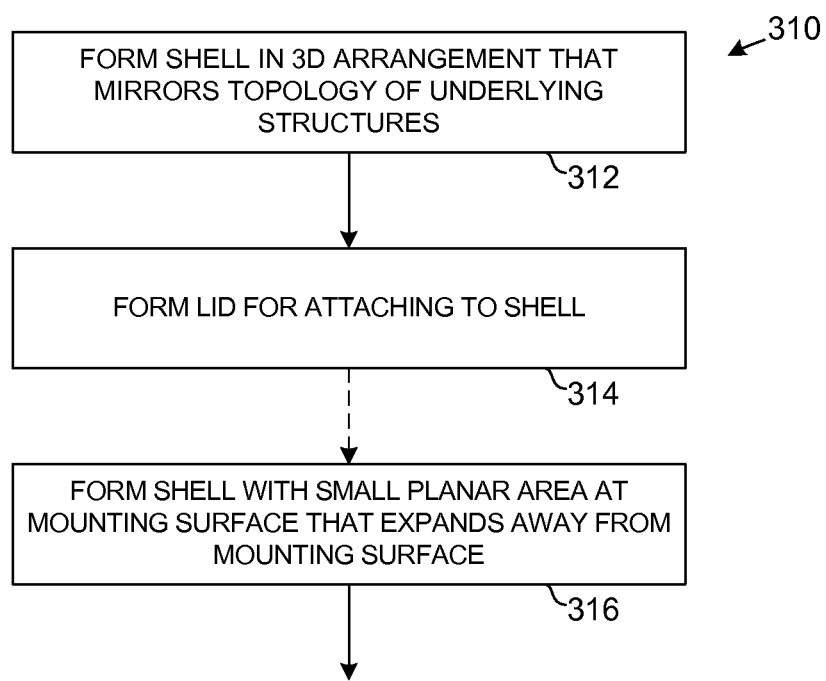
Figure 3C:
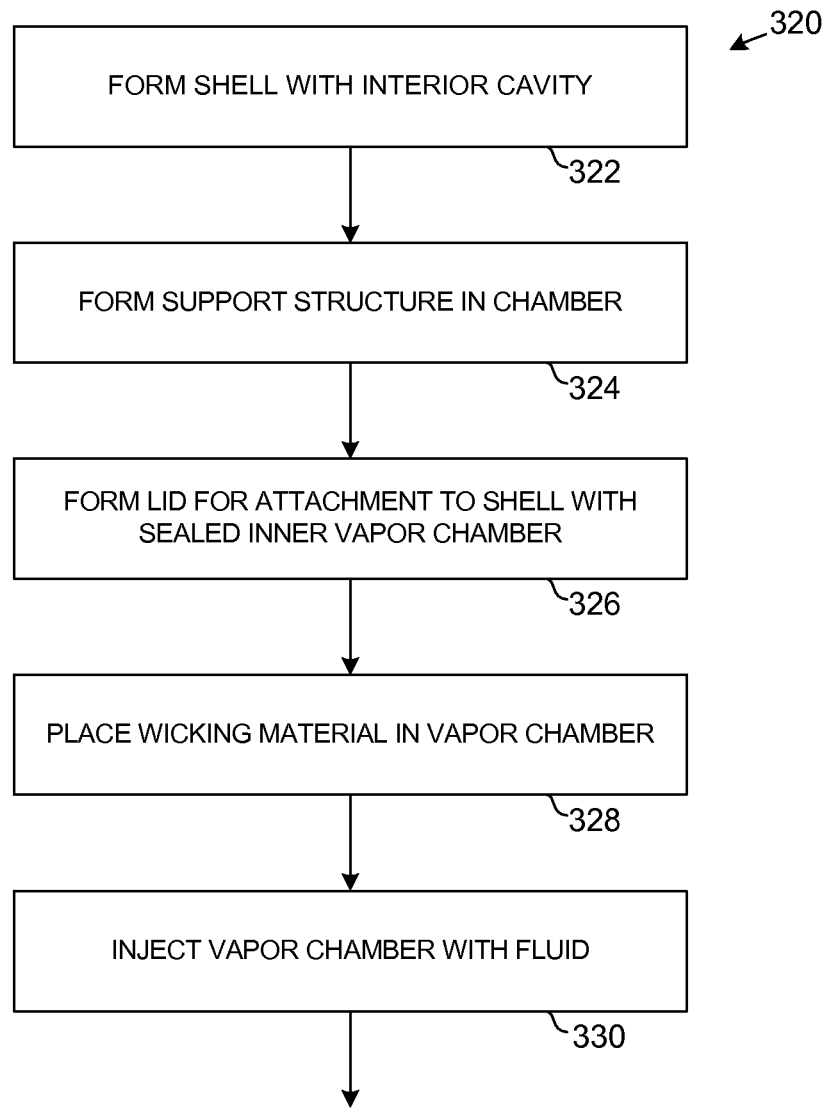

Referring to FIGS. 3A through 3C, multiple flow charts illustrate one or more embodiments or aspects of a method for constructing a heat sink with a surface-formed vapor chamber base. Referring to FIG. 3A, an embodiment of a heat sink construction method 300 comprises determining 302 a topology of a substrate and components mounted on the substrate, and forming 304 a vapor chamber base in a three-dimensional arrangement that mirrors the topology. At least one fin is coupled 306 to the vapor chamber base.

Figure 4:
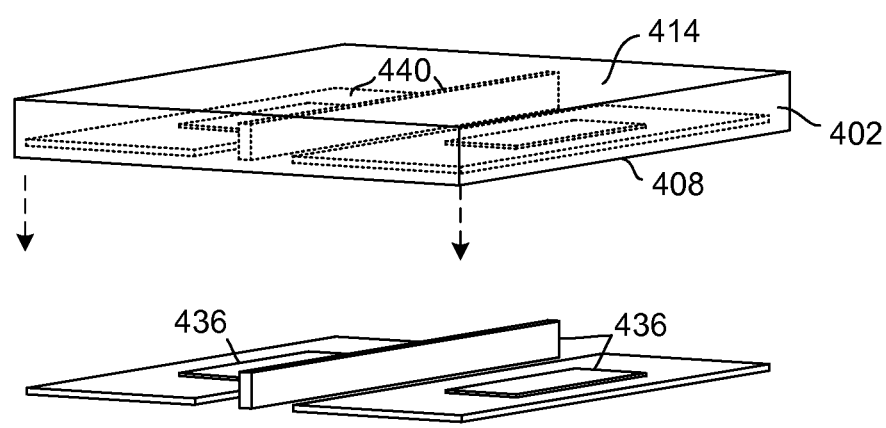
FIG. 4 is an exploded, cross-sectional pictorial view showing a surface-formed structure of the vapor chamber base.

For example, as shown in FIG. 4, an exploded, cross-sectional pictorial view, the surface-formed structure of the vapor chamber base 402 has a shell 408 with an internal cavity 414 formed to accommodate components 436 on the underlying structure in the form of the underlying topology. Accordingly, the vapor chamber base 402 is configured with a surface structure arranged according to a mirror 440 of the components 436. In various embodiments, the surface-formed vapor chamber based can be formed as a deep-drawn structure or can be stamped from a flat sheet to form a cup-like shape.

In some embodiments, multiple fins can be bonded 308 directly to the vapor chamber base.

The vapor chamber base can be formed in a three-dimensional arrangement that extends over obstructions with materials and material thicknesses selected to maintain a uniform base temperature and reduce or minimize conduction losses.

The vapor chamber base can be formed with a thickness selected, based on the components and structures on the underlying system, which is sufficient to raise above and clear obstructions on the underlying topology and extend to a planar surface opposite the underlying topology.

Referring to FIG. 3B, an embodiment of a method 310 for constructing a heat sink can further comprise forming 312 a shell with in a three-dimensional arrangement that mirrors topology of underlying structures and which has thickness sufficient to raise above and clear obstructions on the underlying topology. A planar lid can be formed 314 in a configuration for coupling to the shell.

In some embodiment, the shell is formed 316 with a relatively small planar area at a surface for mounting adjacent the underlying structures and which expands laterally as distance from the underlying structures increases.

Referring to FIG. 3C, an embodiment of a method 320 for constructing a heat sink can further comprise forming 322 the shell with an interior cavity that forms a chamber within the vapor chamber base, and forming 324 a support structure in the chamber in a configuration that increases strength and facilitates fluid transport of the vapor chamber base. The method 320 can further comprise forming 326 the planar lid for attachment to the shell whereby the chamber is a sealed, inner vapor chamber, and placing 328 a wicking material in the vapor chamber for fluid transport from the lid to a heat source. The vapor chamber can be injected 330 with a fluid.

The illustrative heat sink can be used to replace a structure with a thick solid copper pedestal which enables a heat sink to extend above a power pod which surrounds an integrated circuit chip such as a processor chip. The illustrative surface-formed or deep-drawn vapor chamber eliminates the inefficient interface formed by the solid pedestal and enables an increase in heat sink width and length without degradation in performance due to inefficient heat transfer.

The illustrative heat sink, electronic system, and associated construction techniques can significantly improve thermal performance, improve acoustics, and/or lower fan power consumption. The illustrative structures and methods can further facilitate system compaction and/or support of higher power processors or other integrated circuits.

Terms "substantially", "essentially", or "approximately", that may be used herein, relate to an industry-accepted tolerance to the corresponding term. Such an industry-accepted tolerance ranges from less than one percent to twenty percent and corresponds to, but is not limited to, functionality, values, process variations, sizes, operating speeds, and the like. The term "coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. Inferred coupling, for example where one element is coupled to another element by inference, includes direct and indirect coupling between two elements in the same manner as "coupled".

The illustrative block diagrams and flow charts depict process steps or blocks that may represent modules, segments, or portions of code that include one or more executable instructions for implementing specific logical functions or steps in the process. Although the particular examples illustrate specific process steps or acts, many alternative implementations are possible and commonly made by simple design choice. Acts and steps may be executed in different order from the specific description herein, based on considerations of function, purpose, conformance to standard, legacy structure, and the like.

While the present disclosure describes various embodiments, these embodiments are to be understood as illustrative and do not limit the claim scope. Many variations, modifications, additions and improvements of the described embodiments are possible. For example, those having ordinary skill in the art will readily implement the steps necessary to provide the structures and methods disclosed herein, and will understand that the process parameters, materials, and dimensions are given by way of example only. The parameters, materials, and dimensions can be varied to achieve the desired structure as well as modifications, which are within the scope of the claims. Variations and modifications of the embodiments disclosed herein may also be made while remaining within the scope of the following claims.

What is claimed is:

1. A heat sink comprising:
a vapor chamber base formed in a three-dimensional arrangement that mirrors topology of underlying structures on a substrate upon which the heat sink can be mounted, the vapor chamber base formed with a surface that encases sides and top of integrated circuits to maintain a uniform base temperature raised to extend over obstructions on the substrate; and
at least one fin coupled to the vapor chamber base.

2. The heat sink according to claim 1 further comprising:
the vapor chamber base three-dimensional arrangement configured to maintain a controlled distance between an outer edge of the vapor chamber base and the underlying topology.

3. The heat sink according to claim 1 further comprising:
the vapor chamber base three-dimensional arrangement configured to extend over obstructions while maintaining a uniform base temperature and reducing or minimizing conduction losses.

4. The heat sink according to claim 1 further comprising:
a plurality of fins bonded directly to the vapor chamber base.

5. The heat sink according to claim 1 further comprising:
the vapor chamber base formed with a thickness sufficient to rise above and clear obstructions on the underlying topology.

6. The heat sink according to claim 1 further comprising:
the vapor chamber base formed with a thickness sufficient to raise above and clear obstructions on the underlying topology and extending to a planar surface opposite the underlying topology; and
a plurality of fins coupled to the planar surface.

7. The heat sink according to claim 1 further comprising:
the vapor chamber base further comprising:
a shell formed in a three-dimensional arrangement that mirrors topology of underlying structures and has thickness sufficient to raise above and clear obstructions on the underlying topology; and
a planar lid configured for coupling to the shell.

8. The heat sink according to claim 7 further comprising:
the shell configured with a relatively small planar area at a surface for mounting adjacent the underlying structures and expanding laterally as distance from the underlying structures increases.

9. The heat sink according to claim 7 further comprising:
the shell configured with an interior cavity that forms a chamber within the vapor chamber base;
the planar lid configured for attachment to the shell whereby the chamber is a sealed, inner vapor chamber;
a wicking material for placement in the vapor chamber to enable fluid transport from the lid to a heat source; and
fluid for injection into the vapor chamber.

10. The heat sink according to claim 9 further comprising:
a support structure formed in the chamber configured to increase strength and facilitate fluid transport of the vapor chamber base.

11. A method for constructing a heat sink comprising:
determining a topology of a substrate and components mounted on the substrate;
forming a vapor chamber base in a three-dimensional arrangement that mirrors the topology, the vapor chamber base formed with a surface that encases sides and top of integrated circuits to maintain a uniform base temperature raised to extend over obstructions on the substrate; and
coupling at least one fin to the vapor chamber base.

12. The method according to claim 11 further comprising:
forming the vapor chamber base three-dimensional arrangement to extend over obstructions while maintaining a uniform base temperature and reducing or minimizing conduction losses.

13. The method according to claim 11 further comprising:
bonding a plurality of fins directly to the vapor chamber base.

14. The method according to claim 11 further comprising:
forming the vapor chamber base with a thickness sufficient to rise above and clear obstructions on the underlying topology and extend to a planar surface opposite the underlying topology.

15. The method according to claim 11 further comprising:
forming a shell formed in a three-dimensional arrangement that mirrors topology of underlying structures and having thickness sufficient to raise above and clear obstructions on the underlying topology;
forming a planar lid in a configuration for coupling to the shell.

16. The method according to claim 15 further comprising:
forming the shell with a relatively small planar area at a surface for mounting adjacent the underlying structures and expanding laterally as distance from the underlying structures increases.

17. The method according to claim 15 further comprising:
forming the shell with an interior cavity that forms a chamber within the vapor chamber base;
forming a support structure in the chamber in a configuration that increases strength and facilitates fluid transport of the vapor chamber base;
forming the planar lid for attachment to the shell whereby the chamber is a sealed, inner vapor chamber;
placing a wicking material in the vapor chamber for fluid transport from the lid to a heat source; and
injecting fluid into the vapor chamber.

18. An electronic system comprising:
an electronic assembly comprising a substrate and at least one component mounted on the substrate; and a heat sink configured for mounting on the electronic assembly comprising:
   a vapor chamber base formed in a three-dimensional arrangement that mirrors topology of components on the substrate upon which the heat sink is mounted, the vapor chamber base formed with a surface that encases sides and top of integrated circuits to maintain a uniform base temperature raised to extend over obstructions on the substrate; and
   at least one fin coupled to the vapor chamber base.

19. The electronic system according to claim 18 further comprising:
   a plurality of fins bonded directly to the vapor chamber base.

20. The electronic system according to claim 18 further comprising:
   the vapor chamber base further comprising:
      a shell formed in a three-dimensional arrangement that mirrors topology of underlying structures and has thickness sufficient to raise above and clear obstructions on the underlying topology, the shell configured with a relatively small planar area at a surface for mounting adjacent the underlying structures and expanding laterally as distance from the underlying structures increases, the shell configured with an interior cavity that forms a chamber within the vapor chamber base;
      a support structure formed in the chamber configured to increase strength and facilitate fluid transport of the vapor chamber base;
      a planar lid configured for attachment to the shell whereby the chamber is a sealed, inner vapor chamber;
      a wicking material for placement in the vapor chamber to enable fluid transport from the lid to a heat source; and
      fluid for injection into the vapor chamber.

* * * * *